United States Patent
Nakamura

[19]

[11] Patent Number: 5,936,990
[45] Date of Patent: Aug. 10, 1999

[54] SEMICONDUCTOR LASER

[75] Inventor: Takahiro Nakamura, Tokyo, Japan

[73] Assignee: NEC Corporation, Tokyo, Japan

[21] Appl. No.: 08/877,514

[22] Filed: Jun. 17, 1997

[30]    Foreign Application Priority Data

Jun. 20, 1996 [JP]  Japan ................................. 8-159719

[51] Int. Cl.⁶ ................................................. H01S 3/19
[52] U.S. Cl. ............................................ 372/46; 372/45
[58] Field of Search ......................................... 372/46, 45

[56]             References Cited

U.S. PATENT DOCUMENTS 5,596,592   1/1997   Tanigami et al. ......................... 372/46
5,692,002  11/1997   Mizutani ................................. 372/46

OTHER PUBLICATIONS

By K. Uomi et al., "Extremely Low Threshold (1.3 mA) 1.3–μm Compressive–Strained–MQW 10–element Laser Arrays for High–density Optical Interconnects", *Fifth Optoelectronics Conference Technical Digest*, Jul. 1994, pp. 200 and 201.

*Primary Examiner*—Rodney Bovernick
*Assistant Examiner*—Yisun Song
*Attorney, Agent, or Firm*—Young & Thompson

[57]            ABSTRACT

A semiconductor laser includes an active layer and a current block structure where a p-type InP layer (a first layer), an n-type InP layer (a second layer), a p-type InP layer (a third layer) and an n-type InP layer (a fourth layer) are laminated, at least one layer selected from a non-doped InP layer, an n-type InP impurity controlled layer and a p-type InP impurity controlled layer being interposed in at least one interface selected from that between the p-type InP layer (the first layer) and the n-type InP layer (the second layer) and that between the n-type InP layer (the second layer) and the p-type InP layer (the third layer); where, the n-type or p-type InP impurity controlled layer is a layer having such an n-type or p-type, respectively, impurity concentration profile in the layer that the impurity concentration continuously decreases from the n-type InP layer (the second layer) side or from the p-type InP layer (the first or the third layer) side, respectively, to the other side until the concentration of the impurity reaches equal to or below $1 \times 10^{17}$ $cm^{-3}$, and the n-type or p-type, respectively, InP impurity controlled layer is formed so as to be adjacent to the same type InP layer.

8 Claims, 4 Drawing Sheets

SEMICONDUCTOR LASER

BACKGROUND OF THE INVENTION (i) Field of the Invention

The present invention relates to a structure of a semiconductor laser for use in an optical communications system. More specifically, it relates to a semiconductor laser which enables a low threshold, a high efficiency and a high output power even at a high temperature.

(ii) Description of the Prior Art

With the progress of an optical communications technique, the applicable fields of semiconductor lasers are rapidly spreading from a trunk transmission system to systems such as a subscriber system, an LAN and a data link. The semiconductor lasers which can be used in these fields have been used in large quantities in various environments, and there have been demands for semiconductor lasers with excellent environmental resistance and with lower prices. Hence, research and development have been actively conducted. In particular, there has been desired a laser having a low threshold, a high efficiency and a high output power even at a high temperature in order to make the device temperature control-free under no bias from the viewpoints of miniaturization and the cost reduction of a laser module.

In consequence, there have been developed a technique in which a strain MQW structure is employed for an active layer to change a band structure and to thereby increase a gain, and another technique in which a p-type InP substrate is used and a current block structure is formed thereon by a metal organic vapor phase epitaxial growth (MOVPE growth) to reduce a leak current. FIG. 8 shows a structure of a Planer Buried Heterostructure semiconductor laser diode (PBH-LD) for optical communications in which a strain MQW active layer 3 and a current block layer are formed on a p-type InP substrate 1 by the MOVPE growth (5th Optoelectronics Conference Technical Digest, 14D1-2, July 1994). In order to operate this semiconductor laser at a high temperature at a high output, it is necessary to increase the breakdown voltage of the current block layer, and hence, an n-type InP current block layer 7 has been doped at a high concentration, and a p-type InP buried layer 5 and a p-type InP current block layer 9 have been doped at a low concentration.

However, it has been revealed that, in the conventional structure shown in FIG. 8, an optical output tends to be saturated at a high temperature at a high output and the breakdown voltage is low.

SUMMARY OF THE INVENTION

An object of the present invention is to provide a semiconductor laser which can solve the conventional problems and in which a low threshold, a high efficiency and a high output operation are possible at a high temperature.

The present invention is directed to a semiconductor laser which comprises an active layer and a current block structure where a p-type InP layer (a first layer), an n-type InP layer (a second layer), a p-type InP layer (a third layer) and an n-type InP layer (a fourth layer) are laminated, at least one layer selected from a non-doped InP layer, an n-type InP impurity controlled layer and a p-type InP impurity controlled layer being interposed in at least one interface selected from that between the p-type InP layer (the first layer) and the n-type InP layer (the second layer) and that between the n-type InP layer (the second layer) and the p-type InP layer (the third layer).

Here, the n-type InP impurity controlled layer is a layer having such ann-type impurity concentration profile in the layer that the impurity concentration continuously decreases from the n-type InP layer (the second layer) side to the p-type InP layer (the first or the third layer) side until the concentration of the impurity reaches equal to or below $1\times10^{17}$ cm$^{-3}$, and the p-type InP impurity controlled layer is a layer having such a p-type impurity concentration profile in the layer that the impurity concentration continuously decreases from the p-type InP layer (the first or the third layer) side to the n-type InP layer (the second layer) side until the concentration of the impurity reaches equal to or below $1\times10^{17}$ cm$^{-3}$. Furthermore the n-type InP impurity controlled layer is formed so as to be adjacent to the n-type InP layer (the second layer), and the p-type InP impurity controlled layer is formed so as to be adjacent to the p-type InP layer (the first or the third layer).

BRIEF DESCRIPTION OF THE DRAWINGS

FIG. 6 (B) is a graph regarding the Zn diffusion distance measured by changing the impurity concentration in the n-InP layer and the thickness of the u-InP layer.

FIG. 7 (B) is a graph regarding the Zn diffusion distance measured by changing the impurity concentration in the p-InP layer and the thickness of the u-InP layer.

In FIGS. 1 to 8, 1 is a p-InP substrate, 2 is a p-InP clad layer, 3 is an active layer, 4 is an n-InP clad layer, 5 is a p-InP buried layer, 6 is a u-InP layer, 7 is an n-InP current block layer, 8 is the u-InP layer, 9 is a p-InP current block layer, 10 is an n-InP layer, 11 is an n$^+$-InGaAsP contact layer, 12 is a p-side electrode, 13 is an n-side electrode, and 26, 28, 36, 38, 40, 41, 50 and 51 are each an n or p typed InP impurity controlled layer.

DETAILED DESCRIPTION OF THE INVENTION

The present inventors have paid much attention to a fact that, among the four layers of a p-type InP layer (a first layer), an n-type InP layer (a second layer), a p-type InP layer (a third layer) and an n-type InP layer (a fourth layer), the n-type InP layer (the second layer) and the p-type InP layer (the third layer) function as current block layers, but the n-type InP layer (the second layer) is usually thin and so its function as the current block layer decreases by the diffusion of a p-type impurity from the adjacent p-type InP layer. Then, a technique for effectively preventing the diffusion of this p-type impurity has been investigated, and the present invention has now been completed. The functions of a non-doped layer and a impurity controlled layer in the present invention are as follows.

Figure 6A:
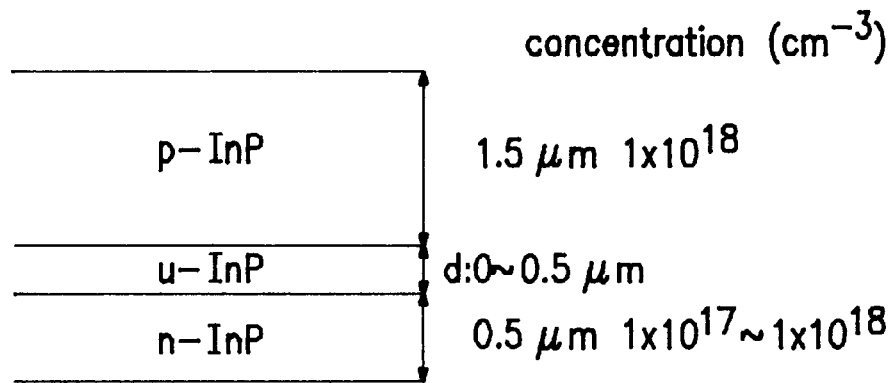
FIG. 6 (A) is a sectional view of a sample which is used to measure a Zn diffusion distance by changing an impurity concentration in an n-InP layer and the thickness of a u-InP layer.
Figure 6B:
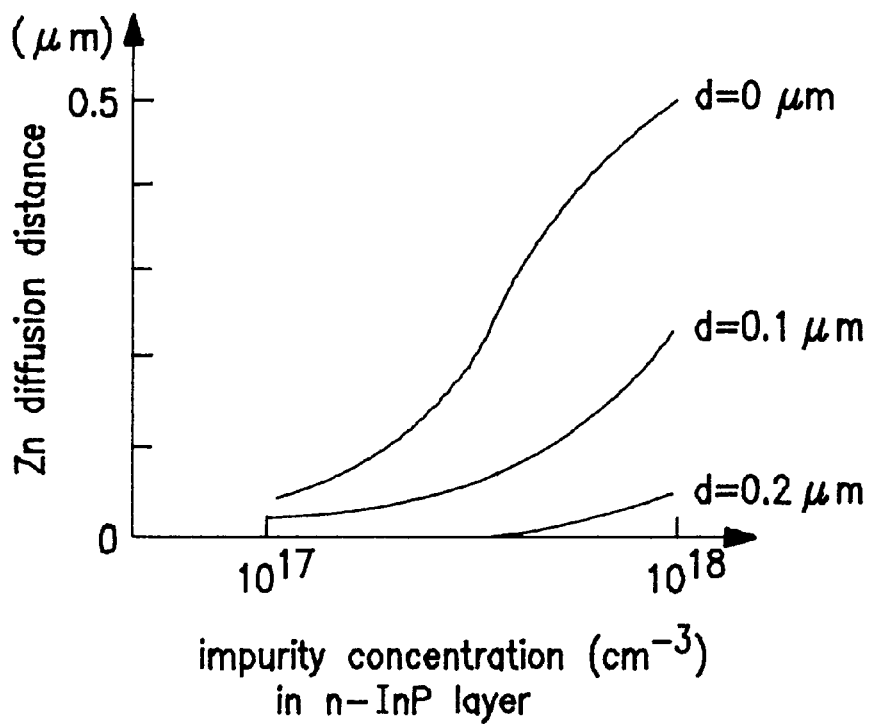

As shown in FIG. 6 (A), each of non-doped InP layers (hereinafter referred to as "the u-InP") having thicknesses (d) of 0 to 0.5 $\mu$m is interposed between an n-type InP layer (impurity Si concentration=$1 \times 10^{17}$ to $1 \times 10^{18}$ cm$^{-3}$) and a p-type InP layer having a constant impurity Zn concentration of $1 \times 10^{18}$ cm$^{-3}$, and FIG. 6 (B) shows a change of a Zn amount diffused from a p-InP layer front in the case that the non-doped InP layer is interposed as described above. When the impurity concentration of the n-type InP layer is $1 \times 10$ cm$^{-3}$ and the non-doped InP layer is not interposed, the diffusion of Zn into the n-type InP layer occurs as deep as about 0.5 $\mu$m. As the thickness of the non-doped InP layer is increased, the diffusion of Zn decreases, so that it is zero in vicinity of 0.2 $\mu$m in depth. Similarly, as the impurity concentration of the n-type InP layer is decreased, the diffusion of Zn decreases.

Figure 7A:
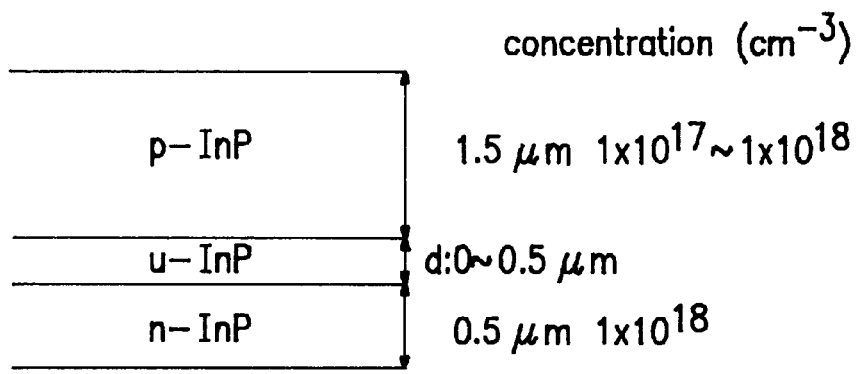
FIG. 7 (A) is a sectional view of a sample which is used to measure a Zn diffusion distance by changing an impurity concentration in a p-InP layer and the thickness of the u-InP layer.
Figure 7B:
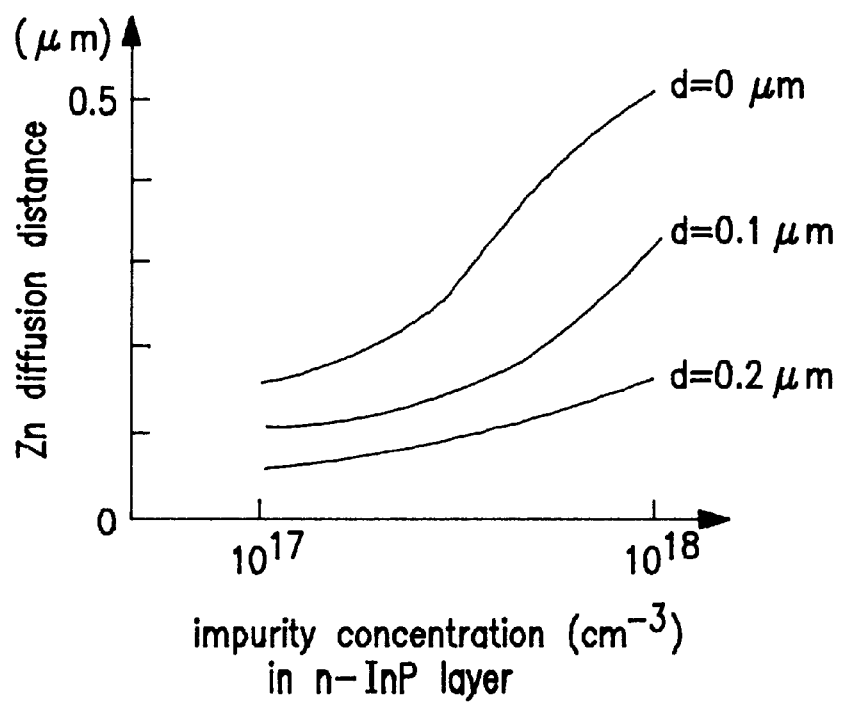

Furthermore, as shown in FIG. 7 (A), each of the non-doped InP layers having various thicknesses is interposed between an n-type InP layer having a constant impurity Si concentration of $1 \times 10^{18}$ cm$^{-3}$ and a p-type InP layer (impurity Zn concentration=$1 \times 10^{17}$ cm$^{-3}$ to $1 \times 10^{18}$ cm$^{-3}$), and FIG. 7 (B) shows a change of a Zn amount diffused from a p-InP layer front in the case that the non-doped InP layer is interposed as described above. Similarly in the case that the n-type impurity concentration is changed, as the concentration of the p-type impurity is low, the diffusion of Zn from the p-InP layer decreases.

That is to say, it is apparent that when any of the non-doped InP layer, the n-type InP impurity controlled layer and the p-type InP impurity controlled layer is interposed between the n-type InP layer and the p-type InP layer in the present invention, the diffusion of Zn which is the p-type impurity can effectively be controlled. In consequence, the breakdown voltage of a current block structure comprising 4 layers of p-n-p-n can be improved.

In the present invention, the concentration of the n-type impurity in the n-type InP impurity controlled layer on the side of the n-type InP layer is preferably set so as to be substantially equal to that of the impurity in the adjacent n-type InP layer, and the concentration of the n-type impurity in the n-type InP impurity controlled layer on the side of the p-type InP layer is preferably set so as to continuously-decrease to $1 \times 10^{17}$ cm$^{-3}$ or less.

In this case, a concentration distribution preferably takes such a profile that the concentration of the n-type impurity neither discontinuously decreases nor increase so that, such a profile that for example, a logarithm of the concentration changes in a linear form to distance in the direction of a layer thickness (hereinafter referred to simply as "the linear form").

The concentration of the p-type impurity in the p-type InP impurity controlled layer is also preferably set as in the case of the concentration of the n-type impurity in the n-type InP impurity controlled layer.

In the present invention, as a layer which is interposed between the p-type InP layer (the first layer) and the n-type InP layer (the second layer), or between the n-type InP layer (the second layer) and the p-type InP layer (the third layer), any of the non-doped InP layer, the n-type InP impurity controlled layer and the p-type InP impurity controlled layer is acceptable, but the impurity controlled layers are particularly preferable, because they can optimize the concentration profile of the impurity so that a steep p-n junction may be obtained after the diffusion, whereby the spread of a depletion region can be restrained.

The thickness of the non-doped InP layer can be suitably set in compliance with the characteristics of the current block structure, but it is usually in the range of 0.1 to 0.5 $\mu$m, in which the effect of the present invention can be achieved. If the non-doped InP layer is too thick, the depletion layer is liable to spread, so that the breakdown voltage deteriorates on occasion. On the other hand, if it is too thin, the n-type InP layer seems to be practically thin owing to the diffusion of a p-type impurity such as Zn, so that the breakdown voltage deteriorates on occasion. Hence, the thickness of the non-doped InP layer is preferably in the range of 0.15 to 0.3 $\mu$m.

The thickness of the n-type InP impurity controlled layer and the p-type InP impurity controlled layer can be suitably set in compliance with the characteristics of the current block structure, but it is usually in the range of 0.1 to 0.5 $\mu$m, in which the effect of the present invention can be achieved. If the n-type InP impurity controlled layer and the p-type InP impurity controlled layer are too thick, the depletion layer is liable to spread, so that the breakdown voltage deteriorates on occasion. On the other hand, if it is too thin, the n-type InP layer seems to be practically thin owing to the diffusion of a p-type impurity such as Zn, so that the breakdown voltage deteriorates on occasion. Hence, the thickness of the n-type InP impurity controlled layer and the p-type InP impurity controlled layer is preferably in the range of 0.15 to 0.3 $\mu$m.

In the present invention, layers selected from the non-doped InP layer, the n-type InP impurity controlled layer and the p-type InP impurity controlled layer are preferably interposed both between the p-type InP layer (the first layer) and the n-type InP layer (the second layer) and between then-type InP layer (the second layer) and the p-type InP layer (the third layer), whereby the breakdown voltage can be further improved. In this case, the two layers to be interposed may be the same or different.

In the present invention, as the layers which can be interposed between the p-type InP layer (the first layer) and the n-type InP layer (the second layer) and/or between the n-type InP layer (the second layer) and the p-type InP layer (the third layer), there can be used, in the form of a laminate, two layers or three layers selected from the group consisting of the non-doped InP layer, the n-type InP impurity controlled layer and the p-type InP impurity controlled layer. For example, there can be used the laminate of the non-doped InP layer and the n-type InP impurity controlled layer, or the laminate of the non-doped InP layer and the p-type InP impurity controlled layer.

Next, the present invention will be described in more detail with reference to examples. In the respective examples, a current block structure is laminated in the order of p-n-p-n on a p-type substrate. Furthermore, in the examples, Zn is used as a p-type impurity and Si is used as an n-type impurity, but impurities which can usually be used are acceptable without any particular restriction.

EXAMPLE 1

Figure 1:
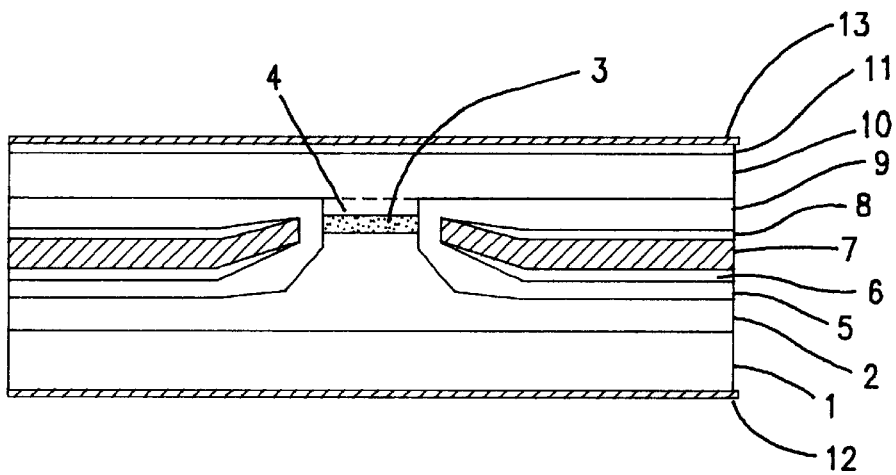
FIG. 1 is a sectional view showing one embodiment of semiconductor laser structures of the present invention.

FIG. 1 shows a method for manufacturing one example of PBH lasers regarding the present invention. By the use of a low pressure MOVPE method, there were continuously grown a p-type InP clad layer 2, a compressively strained InGaAsP-MQW active layer 3 having 5 well layers (the well layers had a 1.4% compressively strained InGaAsP and a thickness of 6 nm, and a barrier layer had a 1.13 $\mu$m wave length InGaAsP, a thickness of 10 nm and an emission wave length of 1.3 $\mu$m) and an n-InP clad layer 4 on a (100) p-InP substrate 1. Afterward, a mesa stripe having a width of 1.2 $\mu$m and a depth of 2.5 $\mu$m was formed by the use of an SiO$_2$ film as a mask, and growth was then carried out by the low pressure MOVPE method to form buried structure, i.e., a p-InP buried layer 5 (impurity concentration=2×10$^{17}$ cm$^{-3}$ and thickness=0.5 $\mu$m), a u-InP (a non-doped InP) layer 6 (thickness=0.2 $\mu$m), an n-InP current block layer 7 (impurity concentration=1×10$^{18}$ cm$^{-3}$ and thickness=0.5 $\mu$m), a u-InP (a non-doped InP) layer 8 (thickness=0.2 $\mu$m) and a p-InP current block layer 9 (impurity concentration=7×10 cm$^{-3}$ and thickness=1 $\mu$m) in this order. After the removal of the SiO$_2$ film, an n-type InP layer 10 (impurity concentration= 1×10$^{18}$ cm$^{-3}$ and thickness=1.5 $\mu$m) and an n$^+$-type InGaAsP contact layer 11 (impurity concentration=1×10$^{19}$ cm$^{-3}$ and thickness=0.4 $\mu$m) were grown all over. The SiO$_2$ film was formed again all over, and a portion alone of the SiO$_2$ film on the active layer was removed in the form of a stripe of 1.5 $\mu$m in width. Finally, a p-side electrode 12 and an n-side electrode 13 were formed to complete the PBH-LD shown in FIG. 1. This laser was evaluated under conditions of a resonator length of 200 $\mu$m, the reflectance of a front coating of 30% and that of a rear coating of 90%. The result revealed that a threshold current and a slope efficiency at room temperature were 3 mA and 0.55 W/A, respectively, and a threshold current and a slope efficiency at 85° C. were 6 mA and 0.4 W/A, respectively. Thus, an output of 35 mW or more could be obtained.

EXAMPLE 2

Figure 2:
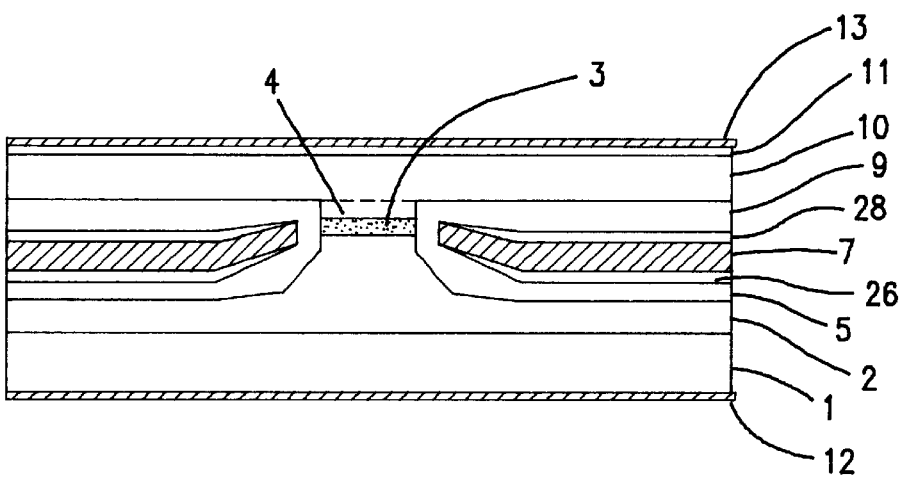
FIG. 2 is a sectional view showing another embodiment of the semiconductor laser structures of the present invention.

FIG. 2 shows a method for manufacturing another example of PBH lasers regarding the present invention. Until the formation of a p-InP buried layer 5 in Example 1, the same procedure as in Example 1 was repeated.

Afterward, growth was successively carried out to form buried structure, i.e., an n-InP impurity controlled layer 26 (an impurity concentration linearly changed from 1×10$^{15}$ cm$^{-3}$ to 1×10$^{18}$ cm$^{-3}$, and thickness=0.2 $\mu$m), an n-InP current block layer 7 (impurity concentration=1×10$^{18}$ cm$^{-3}$ and thickness=0.5 $\mu$m), ann-InP impurity controlled layer 28 (an impurity concentration linearly changed from 1×10$^{18}$ cm$^{-3}$ to 1×10$^{15}$ cm$^{-3}$, and thickness=0.2 $\mu$m) and a p-InP current block layer 9 (impurity concentration=7×10$^{17}$ cm$^{-3}$ and thickness=1 $\mu$m) in this order.

Afterward, all the same procedure as in Example 1 was repeated to complete the PBH-LD shown in FIG. 2. This laser was evaluated under conditions of a resonator length of 200 $\mu$m, the reflectance of a front coating of 30% and that of a rear coating of 90%. The result revealed that a threshold current and a slope efficiency at room temperature were 4 mA and 0.53 W/A, respectively, and a threshold current and a slope efficiency at 85° C. were 7 mA and 0.38 W/A, respectively. Thus, an output of 35 mW or more could be obtained.

EXAMPLE 3

Figure 3:
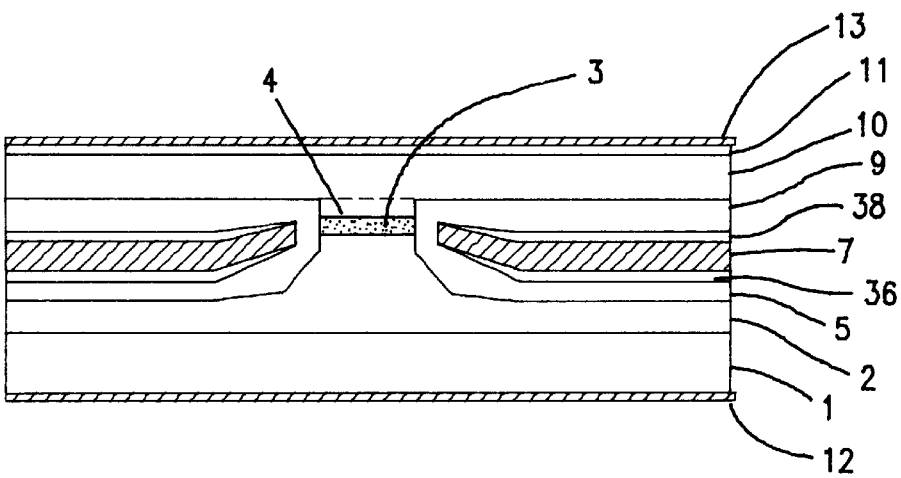
FIG. 3 is a sectional view showing still another embodiment of the semiconductor laser structures of the present invention.

FIG. 3 shows a method for manufacturing still another example of PBH lasers regarding the present invention.

Until the formation of a p-InP buried layer 5 in Example 1, the same procedure as in Example 1 was repeated. Afterward, growth was successively carried out to form buried structure, i.e., a p-InP impurity controlled layer 36 (an impurity concentration linearly changed from 1×10$^{17}$ cm$^{-3}$ to 1×10$^{15}$ cm$^{-3}$, and thickness=0.2 $\mu$m), an n-InP current block layer 7 (impurity concentration 1×10$^{18}$ cm$^{-3}$ and thickness=0.5 $\mu$m), a p-InP impurity controlled layer 38 (an impurity concentration linearly changed from 1×10$^{15}$ cm$^{-3}$ to 7×10$^{17}$ cm$^{-3}$, and thickness=0.2 $\mu$m) and a p-InP current block layer 9 (impurity concentration=7×10$^{17}$ cm$^{-3}$ and thickness=1 $\mu$m) in this order.

Afterward, all the same procedure as in Example 1 was repeated to complete the PBH-LD shown in FIG. 3. This laser was evaluated under conditions of a resonator length of 200 $\mu$m, the reflectance of a front coating of 30% and that of a rear coating of 90%. The result revealed that a threshold current and a slope efficiency at room temperature were 4.5 mA and 0.53 W/A, respectively, and a threshold current and a slope efficiency at 85° C. were 8 mA and 0.38 W/A, respectively. Thus, an output of 35 mW or more could be obtained.

EXAMPLE 4

Figure 4:
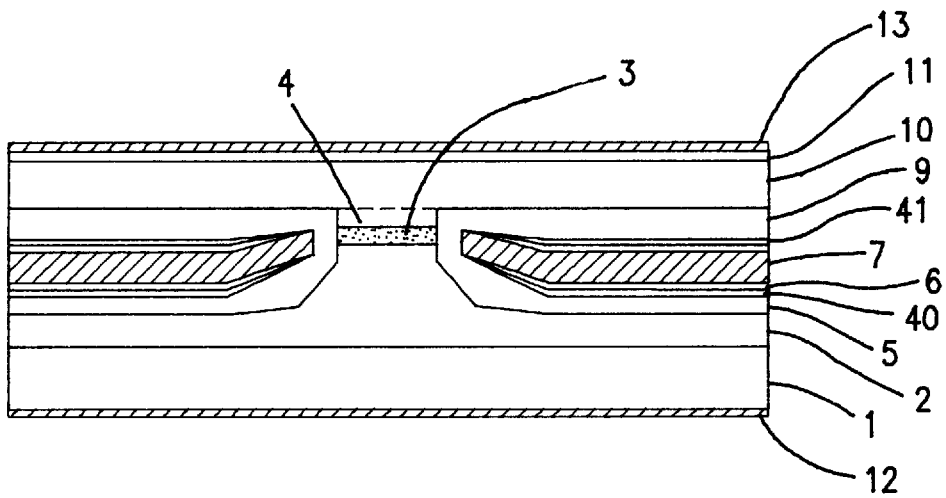
FIG. 4 is a sectional view showing a further embodiment of the semiconductor laser structures of the present invention.

FIG. 4 shows a method for manufacturing a further example of PBH lasers regarding the present invention.

Until the formation of a p-InP buried layer 5 in Example 1, the same procedure as in Example 1 was repeated. Afterward, growth was successively carried out to form buried structure, i.e., a p-InP impurity controlled layer 40 (an impurity concentration linearly changed from 2×10$^{17}$ cm$^{-3}$ to 1×10$^{15}$ cm$^{-3}$, and thickness=0.2 $\mu$m), a u-InP layer 6 (thickness=0.1 $\mu$m), an n-InP current block layer 7 (impurity concentration=1×10$^{18}$ cm$^{-3}$ and thickness=0.5 $\mu$m), a u-InP layer 8 (thickness=0.1 $\mu$m), a p-InP impurity controlled layer 41 (an impurity concentration linearly changed from 1×10$^{15}$ cm$^{-3}$ to 7×10$^{17}$ cm$^{-3}$, and thickness=0.2 $\mu$m) and a p-InP current block layer 9 (impurity concentration=7×10$^{17}$ cm$^{-3}$ and thickness=1 $\mu$m) in this order.

Afterward, all the same procedure as in Example 1 was repeated to complete the PBH-LD shown in FIG. 4. This laser was evaluated under conditions of a resonator length of 200 $\mu$m, the reflectance of a front coating of 30% and that of a rear coating of 90%. The result revealed that a threshold current and a slope efficiency at room temperature were 2.5 mA and 0.58 W/A, respectively, and a threshold current and a slope efficiency at 85° C. were 5 mA and 0.42 W/A, respectively. Thus, an output of 35 mW or more could be obtained.

EXAMPLE 5

Figure 5:
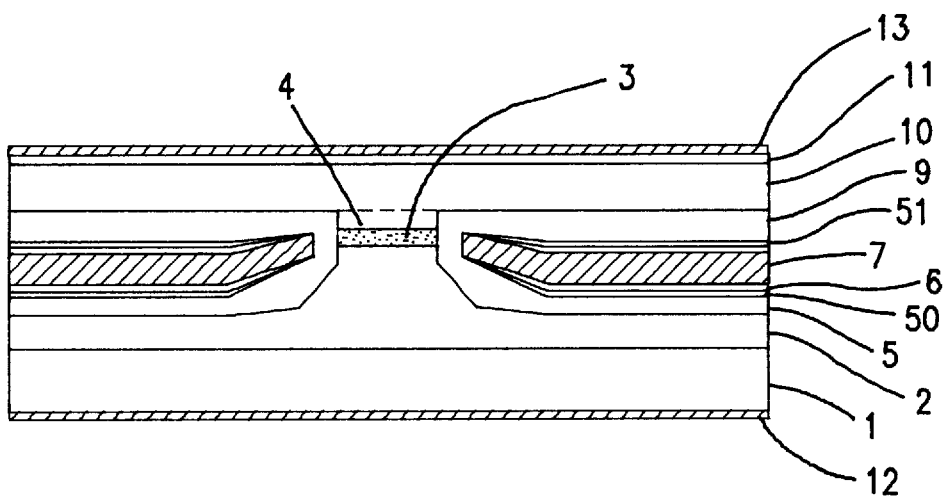
FIG. 5 is a sectional view showing a further embodiment of the semiconductor laser structures of the present invention.
Figure 8:
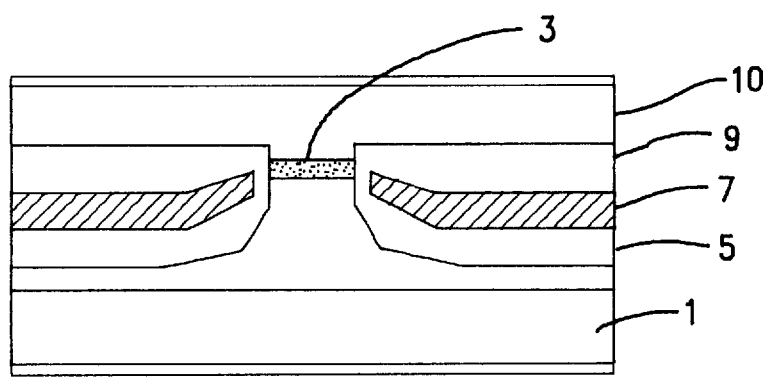
FIG. 8 is a sectional view of a conventional semiconductor laser having a PBH structure.

FIG. 5 shows a method for manufacturing a further example of PBH lasers regarding the present invention.

Until the formation of a p-InP buried layer 5 in Example 1, the same procedure as in Example 1 was repeated. Afterward, growth was successively carried out to form buried structure, i.e., a u-InP layer 6 (thickness=0.1 μm), an n-InP impurity controlled layer 50 (an impurity concentration linearly changed from $1\times10^{15}$ cm$^{-3}$ to $1\times10^{18}$ cm$^{-3}$, and thickness=0.2 μm), an n-InP current block layer 7 (impurity concentration=$1\times10^{18}$ cm$^{-3}$ and thickness=0.5 μm), an n-InP impurity controlled layer 51 (an impurity concentration linearly changed from $1\times10^{18}$ cm$^{-3}$ to $1\times10^{15}$ cm$^{-3}$, and thickness=0.2 μm), a u-InP layer 8 (thickness=0.1 μm) and a p-InP current block layer 9 (impurity concentration=$7\times10^{17}$ cm$^{-3}$ and thickness=1 μm) in this order.

Afterward, all the same procedure as in Example 1 was repeated to complete the PBH-LD shown in FIG. 5. This laser was evaluated under conditions of a resonator length of 200 μm, the reflectance of a front coating of 30% and that of a rear coating of 90%. The result revealed that a threshold current and a slope efficiency at room temperature were 2 mA and 0.58 W/A, respectively, and a threshold current and a slope efficiency at 85° C. were 4.5 mA and 0.42 W/A, respectively. Thus, an output of 35 mW or more could be obtained.

Comparative Example

The same growth as in Example 1 was carried out except that u-InP layers 6 and 8 were not interposed in a structure of a PBH laser of Example 1, thereby preparing the laser. The result showed that a threshold current and a slope efficiency at room temperature were 5 mA and 0.5 W/A, respectively, and a threshold current and a slope efficiency at 85° C. was 10 mA and 0.35 W/A, respectively. At an output of 20 mW, saturation occurred.

It is definite from the comparison between the examples and the comparative example that the present invention enables a low threshold, a high efficiency and a high output operation even at a high temperature.

According to the present invention, a semiconductor laser can be provided in which a low threshold, a high efficiency and a high output operation are possible at a high temperature.

What is claimed is:

1. A semiconductor laser which comprises:
   an active layer;
   a current block structure where a p-type InP layer (a first layer), an n-type InP layer (a second layer), a p-type InP layer (a third layer) and an n-type InP layer (a fourth layer) are laminated;
   a non-doped InP layer laminated on one of an n-type InP impurity controlled layer and a p-type InP impurity controlled layer, which are interposed in at least one interface selected from that between the p-type InP layer (the first layer) and the n-type InP layer (the second layer) and that between the n-type InP layer (the second layer) and the p-type InP layer (the third layer),
   wherein, the n-type InP impurity controlled layer is a layer having such an n-type impurity concentration profile in the layer that the impurity concentration continuously decreases from the n-type InP layer (the second layer) side to the p-type InP layer (the first or the third layer) side until the concentration of the impurity reaches equal to or below $1\times10^{17}$ cm$^{-3}$, and the p-type InP impurity controlled layer is a layer having such a p-type impurity concentration profile in the layer that the impurity concentration continuously decreases from the p-type InP layer (the first or the third layer) side to the n-type InP layer (the second layer) side until the concentration of the impurity reaches equal to or below $1\times10^{17}$ cm$^{-3}$, and the n-type InP impurity controlled layer is formed so as to be adjacent to the n-type InP layer (the second layer), and the p-type InP impurity controlled layer is formed so as to be adjacent to the p-type InP layer (the first or the third layer).

2. The semiconductor laser according to claim 1 wherein the impurity concentration profile in the n-type InP impurity controlled layer or the p-type InP impurity controlled layer is such that a logarithm of the concentration changes in a linear form to distance in the direction of a layer thickness.

3. A semiconductor laser which comprises:
   an active layer;
   a current block structure where a p-type InP layer (a first layer), an n-type InP layer (a second layer), a p-InP layer (a third layer) and an n-type InP layer (a fourth layer) are laminated; and
   a first non-doped InP layer between the first layer and the second layer and a second non-doped InP layer between the second layer and the third layer.

4. The semiconductor laser of claim 3, further comprising one of an n-type InP impurity controlled layer and a p-type InP impurity controlled layer laminated on at least of the first and second non-doped InP layers,
   wherein, the n-type InP impurity controlled layer is a layer having such an n-type impurity concentration profile in the layer that the impurity concentration continuously decreases from the second layer side to the first or the third layer side until the concentration of the impurity reaches equal to or below $1\times10^{17}$ cm$^{-3}$, and the p-type InP impurity controlled layer is a layer having such a p-type impurity concentration profile in the layer that the impurity concentration continuously decreases from the first or the third layer side to the second layer side until the concentration of the impurity reaches equal to or below $1\times10^{17}$ cm$^{-3}$, and the n-type InP impurity controlled layer is formed so as to be adjacent to the second layer, and the p-type InP impurity controlled layer is formed so as to be adjacent to the first or the third layer.

5. A semiconductor laser which comprises:
   an active layer;
   a current block structure where a p-type InP layer (a first layer), an n-type InP layer (a second layer), a p-InP layer (a third layer) and an n-type InP layer (a fourth layer) are laminated; and
   at least one layer selected from an n-type InP impurity controlled layer and a p-type InP impurity controlled layer interposed in at least one interface selected from that between the first layer and the second layer and that between the second layer and the third layer,
   wherein, the n-type InP impurity controlled layer is a layer having such an n-type impurity concentration profile in the layer that the impurity concentration continuously decreases from the second layer side to the first or the third layer side until the concentration of the impurity reaches equal to or below $1\times10^{17}$ cm$^{-3}$, and the p-type InP impurity controlled layer is a layer having such a p-type impurity concentration profile in the layer that the impurity concentration continuously decreases from the first or the third layer side to the second layer side until the concentration of the impurity reaches equal to or below $1\times10^{17}$ cm$^{-3}$, and the n-type InP impurity controlled layer is formed so as to be adjacent to the second layer, and the p-type InP impurity controlled layer is formed so as to be adjacent to the first or the third layer.

6. The semiconductor laser according to claim 5, wherein the impurity concentration profile in the n-type InP impurity controlled layer or the p-type InP impurity controlled layer is such that a logarithm of the concentration changes in a linear form to distance in the direction of a layer thickness.

7. The semiconductor laser of claim 5, wherein one said n- or p-type impurity controlled layer is between the first layer and the second layer and another said n- or p-type impurity controlled layer is between the second layer and the third layer.

8. The semiconductor laser of claim 7, further comprising a non-doped InP layer laminated on each of said n- or p-type impurity controlled layers.

* * * * *